United States Patent [19]

Morino et al.

[11] Patent Number: 4,617,650

[45] Date of Patent: Oct. 14, 1986

[54] MEMORY MODULE FOR A PROGRAMMABLE ELECTRONIC DEVICE

[75] Inventors: Masuaki Morino, Soraku; Yuji Takada, Yamatokoriyama, both of Japan

[73] Assignee: Sharp Kabushiki Kaisha, Osaka, Japan

[21] Appl. No.: 519,148

[22] Filed: Aug. 1, 1983

[30] Foreign Application Priority Data

Aug. 3, 1982 [JP] Japan ................................ 57-135960

[51] Int. Cl.⁴ .............................................. G11C 13/00
[52] U.S. Cl. ...................................... 365/195; 365/226
[58] Field of Search ........................ 365/195, 182, 226

[56] References Cited

U.S. PATENT DOCUMENTS 3,737,879  6/1973  Greene et al. ...................... 365/182
4,330,852  5/1982  Redwine et al. .................... 365/182
4,457,021  6/1984  Belisomi ............................ 365/229

Primary Examiner—Terrell W. Fears
Attorney, Agent, or Firm—Birch, Stewart, Kolasch and Birch

[57] ABSTRACT

A memory module is provided for read/writing a program. The memory module is connected to a programmable device including a programmable electronic calculator, a personal computer, a computer, or a word processing device such as a word processor and a language dictionary. A switch is provided for selectively supplying read/write control signals to the memory module. The memory module includes a plurality of memory areas which may be selectively disconnected from the read/write control signals to prevent reading/writing therein.

5 Claims, 7 Drawing Figures

MEMORY MODULE FOR A PROGRAMMABLE ELECTRONIC DEVICE

BACKGROUND OF THE INVENTION

The present invention relates to a programmable device and, more particularly, to a memory module for a programmable device.

Recently, many programmable devices have been proposed such as a programmable electronic calculator, a personal computer, and a word data processing device such as a word processor and a language dictionary. To these programmable devices, a read/write memory (RAM) or a read-only memory (ROM) module is connected which stores a program for the programmable devices to execute the program. Any program can be entered into the RAM module by operation of key switches by the operator. The ROM module stores the program, preliminarily, prior to the operation by the operator. Since the widely sold ROM modules are directed to general purposes, a specific program appropriate to a specific programmable device is not recorded. To make the programmable devices specific to the operator, the RAM module would be preferred to the ROM module because a new program can be stored into the RAM module by operating the key switches.

However, the stored program in the RAM module may be damaged by erroneous key input operations. In such a case, the program input must be repeated from the beginning.

Therefore, it is desired that the RAM module is prevented from being damaged even by misoperating the key switches.

SUMMARY OF THE INVENTION

Accordingly, it is an object of the present invention to provide an improved memory module which cannot be damaged by misoperating key inputs.

It is another object of the present invention to provide an improved programmable device containing a memory module for preventing the memory module from being damaged even by misoperating key inputs.

It is a further object of the present invention to provide an improved switch for selectively supplying read/write control signals to a memory module for a programmable device.

Briefly described, in accordance with the present invention, a memory module is provided for reading/writing a program. The memory module is connected to a programmable device including a programmable electronic calculator, a computer, a personal computer, and a word data processing device such as a word processor and a language dictionary. A switch is provided for selectively supplying read/write control signals to the memory module.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

A memory module of the present invention can be applied to any type of programmable device including a programmable electronic calculator, a personal computer, a computer, a word processor, or a language dictionary. In a preferred form of the present invention, a computer is the programmable device.

Figure 1:
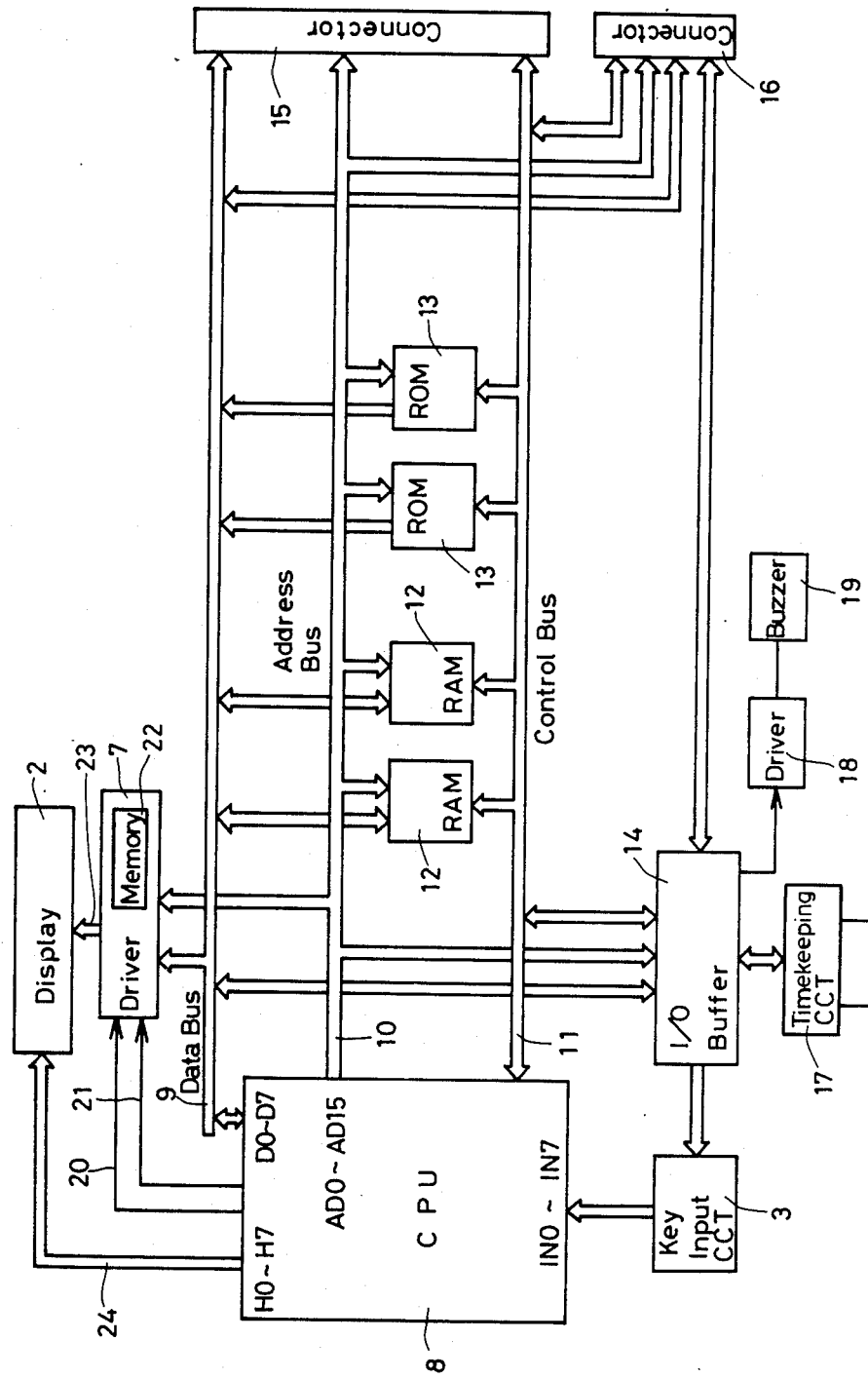
FIG. 1 shows a block diagram of a circuit implemented within a programmable device according to the present invention.

FIG. 1 shows a block diagram of a circuit of such a computer.

The circuit of FIG. 1 comprises a display 2, a key input circuit 3, a display driver 7, a CPU 8, one or more read/write memories 12 each composed of a random access memory (RAM), one or more read-only memories (ROMs) 13, an input/output (I/O) buffer 14, two connectors 15 and 16, a timekeeping circuit 17, a buzzer driver 18, and a buzzer 19.

A display memory 22 is provided within the display driver 7. A data bus 9, an address but 10, a control bus 11, and lines 20, 21, 23, and 24 are connected for data communication.

The display driver 7 is provided for activating a plurality of dots in the display 2. The data bus 9 and the address bus 10 are connected to the display driver 7. The data bus 9, the address bus 10, and the control bus 11 are connected between the CPU 8, the RAM 12, the ROM 13, the I/O buffer 14, and the connectors 15 and 16.

Key strobe signals from the I/O buffer 14 are entered into the key input circuit 3, so that key return signals are generated by activating key switches of the key input circuit 3, and entered into the CPU 8.

The RAMs 12 and the ROMs 13 are all installed within the body of the computer. Each of the RAMs 12 contains a system area used for registers and flags. Each of the ROMs 13 stores an interpreter for executing a program and other control programs. The connector 15 is provided for connecting the memory modules. The connector 16 is provided for connecting an input/output device such as a data recoder and a printer additionally attached.

The timekeeping circuit 17 is connected to the I/O buffer 14. The timekeeping circuit 17 is coupled by a crystal oscillator. The buzzer driver 18 is responsive to the output of the I/O buffer 14 for activating the buzzer 19.

The CPU 8 develops to the display driver 7, display ON/OFF signals through the line 20, and synchronization signals through the line 21. The display driver 7 includes the display memory 22 for containing memory locations each corresponding to the dots of the display 2. The display driver 7 develops segment signals to the display 2 through the line 23. The CPU 8 develops backplate signals to the display 2 through the line 24.

Figure 2:
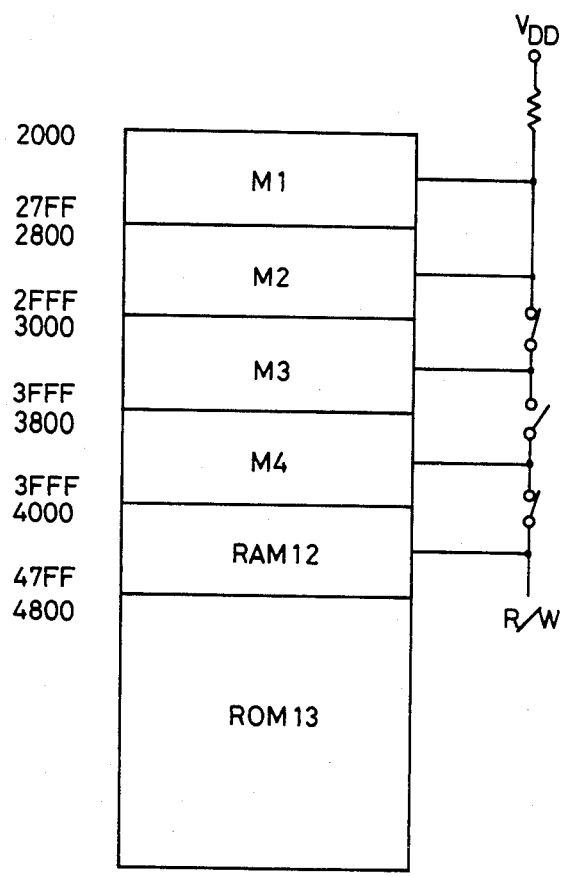
FIG. 2 shows an address space of a memory according to the present invention.

FIG. 2 shows an address space of the memory used for the present invention.

The address space of FIG. 2 is formed by the RAM 12 and the ROM 13 both installed within the body of the computer and connected within the circuit of FIG. 1, and memories M1 to M4 installed within a memory module which can be attached to and removed from the body of the computer. Basically, the memory module is of the random access memory.

The memory module comprises four RAMs each having a 2K byte capacity. The operational capacity of the memory module can be expanded from address "3FFF" to "2000", over a 8K byte.

R/W signals are applied to read/write data in the memory module. Some, preferably three, switches are provided for selectively supplying the R/W signals to the respective memory locations of the memory module.

With the help of the conditions of the switches as shown in FIG. 2, the R/W signals are applied only to the RAM 12 and the memory M4 while the R/W signals are not imparted to the memories M1, M2, and M3. This means that the data from the CPU 8 is accessible to both the RAM 12 within the body of the computer and the memory M4 of the memory module to write the data therein. Therefore, this indicates that the other memories M1, M2, and M3 are employed merely as a read-only memory (ROM), which is called a ROM-condition herein.

That is, the memory space of the memories M1, M2, and M3, namely, the address spaces of "2000" to "37FF" are separated from the key input operations. Therefore, the memory contents of these memories are blocked from being damaged by any erroneous key inputs. An objective program should be stored in these memory locations of the ROM-condition, so that the storage data are not damaged.

According to this preferred embodiment of the present invention, the program is stored from the lowest address "2000" of the RAM region to a higher location. The numeral variables and character variables used for the program are stored from the highest location address "47FF" of the RAM region to a lower location. Depending on the program capacity and the variable capacity to be stored, the memories of the ROM-condition can be freely changed, so that the ROM-condition memory can be placed on any desired location. Various kinds of programs can be stored as the ROM-condition memory.

The capacity of the stored program can be recognized by executing a program capacity access instruction. The capacity of the variable regions can be recognized by executing a variable capacity access instruction.

Figure 3:
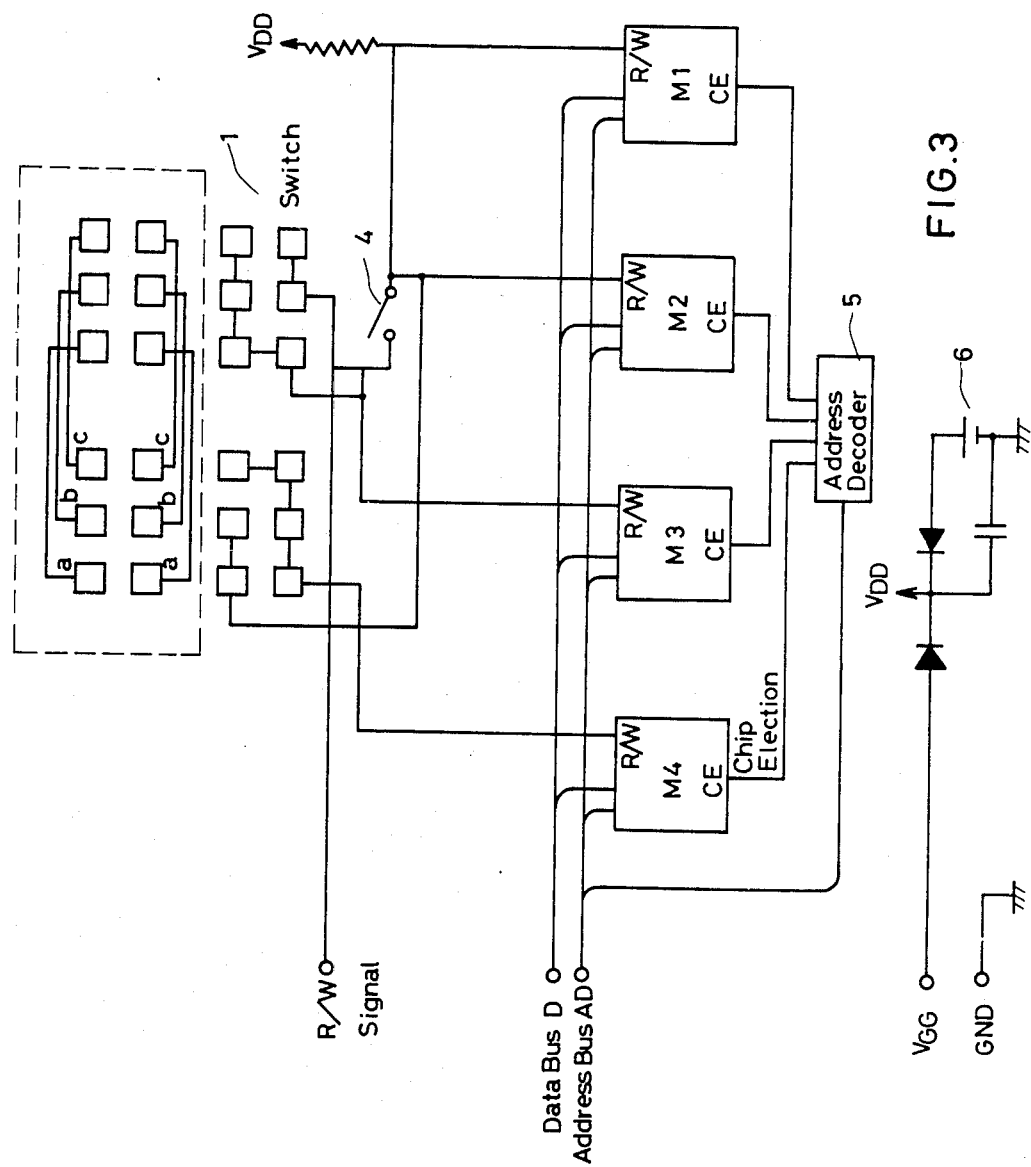
FIG. 3 shows a block diagram of the memory of FIG. 2.

FIG. 3 shows a block diagram of the memory module according to the present invention.

The circuit of the memory module as shown in FIG. 3 comprises the memories M1 to M4 each having a 2K byte capacity as shown in FIG. 2, an address decoder 5, a group of switches 1, and a single switch 4. An address bus AD and a data bus D are connected to communicate the data between the memories and the address decoder 5. The read/write (R/W) signals and chip selection signals CE are generated.

The address decoder 5 is connected to the memories M1 to M4. The group of switches 1 correspond to the switches as shown in FIG. 2. The selection of positions "a", "b", and "c" of actuators of the switches 1 defines the capacity of the memory to be placed in the ROM-condition. The single switch 4 becomes conductive to make all the memories operative as random access memory regardless the selected positions of the switches 1.

A power energy VDD is supplied from a power source VGG of the body of the computer while the memory module is attached to the computer. A battery 6 is installed within the body of the module, so that the memory contents are maintained for a few years after the module is removed from the body of the computer. Of course, while the memory module is attached to the body of the device, the battery 6 is scarcely consumed.

The switches 1 are operated as follows according to the present invention.

As stated above, while the single switch 4 is conductive, the R/W signals can be applied to all the memories M1 to M4 regardless of any condition of the switches 1. When the switch 4 is nonconductive and the switches 1 are placed at the position "a", the R/W signals are applied to no memories. When the switch 4 is nonconductive and the switches 1 are placed at the position "b", the R/W signals are entered into only the memory M4. When the switch 4 is nonconductive and the switches 1 are placed at the postion "c", the R/W signals are entered into only the memories M3 and M4.

Table I shows the above relations.

TABLE I

| Switch 4 | Switches 1 | | |
|---|---|---|---|
| | "a" | "b" | "c" |
| ON | 0 | 0 | 0 |
| OFF | 8K | 6K | 4K |

In TABLE I, the numerals indicate the capacity of the memories of the memory module as selected to become the ROM-condition.

While the single switch 4 is conductive, a program is stored into one or more memories of the memory module. Depending on the program capacity and the amount of the variables to be used for the program, the switches 1 are selectively operated. Therafter, the single switch 4 is nonconductive, so that the stored program is stored in term of the ROM-condition.

Figures 4A, 4B, 4C:
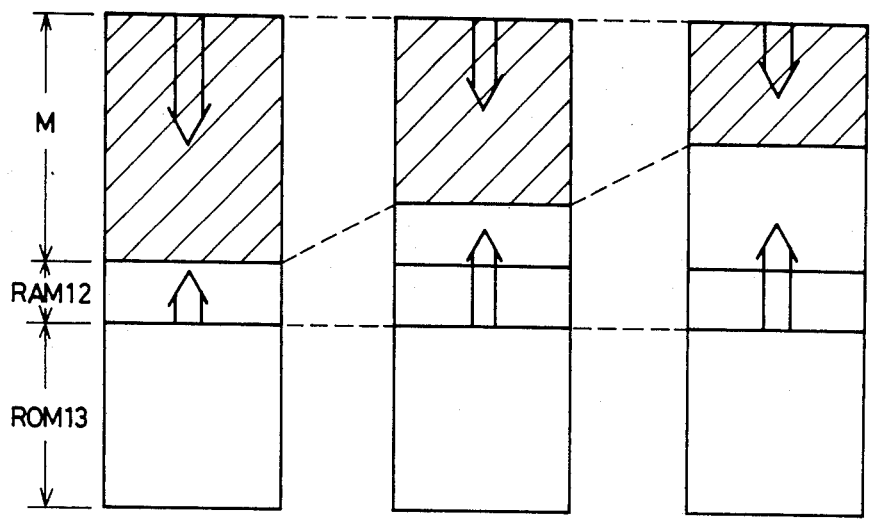
FIGS. 4(a) to 4(c) show conditions of the memory according to the present invention.

FIGS. 4(a) to 4(c) show the relation between the selected conditions of the switches 1 and the memory regions operative as the ROM-condition. In FIGS. 4(a) to 4(c), the shadowed regions indicate the memory regions operative as the ROM-condition. White regions indicate a RAM-condition region.

Conventionally, the program memory modules now available in the market cannot show a list of storage data. To be suitable for the present invention, a predetermined memory location should have a code indicating a secret program, so that the command for listing the program becomes invalid.

After the secret code is stored into a location, the location and its related locations are changed to become the ROM-condition, so that the program can be made secret.

Figure 5:
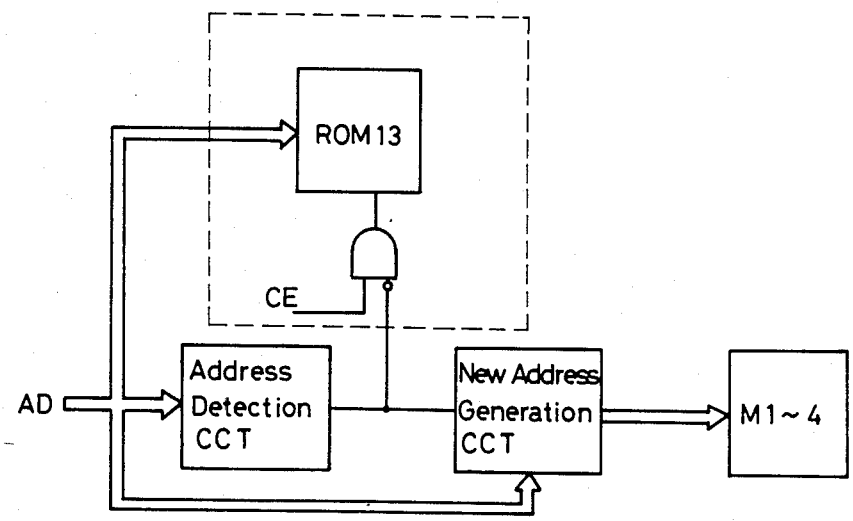
FIG. 5 shows a block diagram of the circuit according to another preferred form of the present invention.

To provide another form of making the program secret, FIG. 5 shows a block diagram of a circuit for making the program secret.

The circuit of FIG. 5 comprises a ROM 13, an address detection circuit, a new address generation circuit, and memories M1 to M4.

An address bus is connected to the address detection circuit. The address detection circuit is provided for detecting addresses of the commands related for outputting the program locations. When the program list commands are performed, the addresses of the interpreter of the program list commands are selected, so that the address detection circuit outputs detection signals of the address information. The area surrounded by the dotted lines indicates the body of the computer. The ROM 13 is installed within the body of the computer. An inhibit gate is connected, by which the generation of the chip selection signals CE does not allow the ROM 13 to be selected.

The new address generation circuit provides address signals to the specific addresses to the memories M1 to M4. Even when it is selected that the interpreter of the program list commands of the ROM 13 is to be performed, the selection of a specific address in one of the memories M1 to M4 is performed. If a jump command is stored into the specific address of the memories M1 to M4, which is to jump the program into an error operation, the selection of the program list commands permits the program to perform the error operations, so that the program is made secret.

According to the present invention, even when any erroneous key input operation is carried out, the stored program can be reserved.

It may be possible that all the required memories are installed within the body of the computer and any switch may be provided for selecting the ROM-condition.

While only certain embodiments of the present invention have been described, it will be apparent to those skilled in the art that various changes and modifications may be made therein without departing from the spirit and scope the present invention as claimed.

What is claimed is:

1. A memory module connectable to a programmable electronic device comprising:

input means for introducing information into said device;

means for developing a write command;

memory means, responsive to the write command developed by said means for developing, for storing said information introduced by said input means therein, said memory means including a plurality of independently addressable read/write memory areas;

inhibit means, disposed between said means for developing and said memory means, for inhibiting the application of said write command to selected ones of said plurality of independently addressable read/write memory areas, which form less than all of said plurality of memory areas to thereby prevent undesired damage to the contents of these inhibited memory areas.

2. The module of claim 1 wherein said inhibit means comprises at least one switch connected between a said independently addressable read/write memory area and said area for developing a write command.

3. The module of claim 1 wherein said memory means comprises random access memory means and wherein said programmable electronic device is selected from the group consisting of a programmable electronic calculator, a computer, a word processing device, and a language dictionary.

4. The module of claim 1 further comprising:

means for inhibiting the listing of a selected program stored in said inhibited memory areas.

5. The module of claim 1 wherein the inhibiting of the application of said write command to said selected ones of said plurality of independently addressable read/write memory areas is operator selectable.

* * * * *